United States Patent
Tan

(10) Patent No.: US 10,705,573 B2
(45) Date of Patent: Jul. 7, 2020

(54) ACTIVE-MATRIX ORGANIC LIGHT EMITTING DIODE MODULE OPERABLE IN BENDABLE STATES AND DISPLAYING METHOD THEREOF

(71) Applicant: Wuhan China Star Optoelectronics Semiconductor Display Technology Co., Ltd., Wuhan (CN)

(72) Inventor: Li Tan, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 99 days.

(21) Appl. No.: 16/088,124

(22) PCT Filed: Aug. 28, 2018

(86) PCT No.: PCT/CN2018/102663
§ 371 (c)(1),
(2) Date: Sep. 25, 2018

(87) PCT Pub. No.: WO2019/223156
PCT Pub. Date: Nov. 28, 2019

(65) Prior Publication Data
US 2019/0355299 A1    Nov. 21, 2019

(30) Foreign Application Priority Data

May 21, 2018    (CN) .......................... 2018 1 0485545

(51) Int. Cl.
*G06F 1/16* (2006.01)
*G09G 3/3225* (2016.01)
(Continued)

(52) U.S. Cl.
CPC .......... *G06F 1/1677* (2013.01); *G06F 1/1652* (2013.01); *G09G 3/3225* (2013.01);
(Continued)

(58) Field of Classification Search
CPC ............. G09G 3/3225; G09G 2354/00; G09G 2380/02; G09G 5/14; H01L 27/3276;
(Continued)

(56) References Cited

U.S. PATENT DOCUMENTS

| 2011/0134145 A1* | 6/2011 | Moriwaki | ............ | G09G 3/3208 |
| | | | | 345/660 |
| 2013/0265221 A1* | 10/2013 | Lee | .......................... | G06F 3/01 |
| | | | | 345/156 |

(Continued)

FOREIGN PATENT DOCUMENTS

| CN | 103425243 | 12/2013 |
| CN | 105742334 | 7/2016 |
| CN | 107402662 | 11/2017 |

*Primary Examiner* — David Tung

(57) ABSTRACT

The present disclosure provides an AMOLED display module and displaying method for operable in different bendable states, which the displaying state of a display panel can be directly controlled by a driver chip because a bending state sensor is disposed on a bendable region of the display panel and directly coupled with the driver chip. It increases the efficiency and compatibility.

7 Claims, 3 Drawing Sheets

Open state

Half open state

First close state

Second close state

(51) Int. Cl.
  *G09G 3/3275* (2016.01)
  *H01L 27/32* (2006.01)
  *H01L 51/00* (2006.01)
  *H05K 1/18* (2006.01)
  *G09F 9/33* (2006.01)
  *G09F 9/30* (2006.01)
  *G09G 5/14* (2006.01)

(52) U.S. Cl.
  CPC ....... *G09G 3/3275* (2013.01); *H01L 27/3276* (2013.01); *H01L 51/0097* (2013.01); *H05K 1/189* (2013.01); *G09G 2380/02* (2013.01); *H01L 2251/5338* (2013.01); *H05K 2201/10128* (2013.01); *H05K 2201/10151* (2013.01)

(58) Field of Classification Search
  CPC ............ H01L 27/3244; H01L 51/0097; H01L 2251/5338; H05K 1/189; H05K 2201/10151; H05K 2201/10128; G06F 1/1652; G06F 1/1677; G09F 9/33; G09F 9/301
  See application file for complete search history.

(56) References Cited

U.S. PATENT DOCUMENTS

| | | | |
|---|---|---|---|
| 2013/0307816 A1* | 11/2013 | Lee | G06F 1/1652 345/174 |
| 2017/0060189 A1* | 3/2017 | Sohn | G06F 1/1684 |
| 2017/0123558 A1* | 5/2017 | Hong | G09G 3/3258 |
| 2017/0221456 A1* | 8/2017 | Kim | G06F 1/1615 |
| 2018/0018929 A1* | 1/2018 | Xun | G06F 1/1652 |
| 2018/0107306 A1* | 4/2018 | Hong | G01B 7/026 |
| 2018/0366529 A1* | 12/2018 | Lee | H01L 27/3262 |
| 2019/0245012 A1 | 8/2019 | Ito | |

* cited by examiner

ACTIVE-MATRIX ORGANIC LIGHT EMITTING DIODE MODULE OPERABLE IN BENDABLE STATES AND DISPLAYING METHOD THEREOF

RELATED APPLICATIONS

This application is a National Phase of PCT Patent Application No. PCT/CN2018/102663 having International filing date of Aug. 28, 2018, which claims the benefit of priority of Chinese Patent Application No. 201810485545.4 filed on May 21, 2018. The contents of the above applications are all incorporated by reference as if fully set forth herein in their entirety.

FIELD AND BACKGROUND OF THE INVENTION

The present invention relates to the field of display technologies, and more particularly to active-matrix organic light emitting diode (AMOLED) module and displaying method for operable in different bendable states.

DESCRIPTION OF PRIOR ART

An active-matrix organic light emitting diode (AMOLED) module having a characteristic of self-illuminated may replace a backlight module used in a traditional liquid crystal display (LCD) panel, massively reducing the thickness of an entire display. The AMOLED products can be made to be bendable by using flexible substrates, and are capable of fulfilling the demands of future bendable mobile devices.

In general, the bendable mobile device is operable in at least two mechanism states, e.g. an open state, a half open state and a close state. While the AMOLED module is operated in the open state, it is manipulated as a tablet for a larger displaying size of a panel. While the AMOLED module is operated in the half open state, it is manipulated as an electronic book for reading or playing video games. While the AMOLED module is operated in the close state, it is manipulated as a normal phone.

A determining mechanism is needed to determine the current bending state of the display panel for complying with abovementioned situations. A commonly utilized method is equipped with transmitting and receiving units in four corners of the device. The receiving unit receives a signal from the transmitting unit for a determination of bending state when the display panel is bended as a specific extent. Consequently, the determination of bending state is transmitted to a main control chip. A signal is transmitted to a driver chip for displaying by the displaying panel after the determination of bending state is handled and processed by the main control chip. However, in this determining mechanism, the signal received by the receiving unit is still needed to be processed and handled by the main control chip, it consumes part of processing resources of main control chip and downgrades the efficiency of the determination.

SUMMARY OF THE INVENTION

In view of the deficiency of the conventional technology described above, an objective of the present disclosure is to provide an AMOLED module and displaying method for operable in different bendable states for resolving the technical problems of downgrading efficiency of the determination due to the resource consumption of the main control chip of AMOLED module while determining the bending states.

The present disclosure provides an AMOLED module operable in at least two bendable states. The AMOLED module comprises a display panel, a driver chip, and a bending state sensor. The display panel is configured to display various display interfaces corresponding to different bendable states. The display panel comprises a bendable region. The driver chip is configured to determine a bending state of the display panel according to different electrical signals, and configured to control a displaying state of the display panel according to corresponding bending state. The driver chip is disposed in the display panel and electrically coupled with the display panel. A bending state sensor, configured to receive a pressure signal when the display panel is bended, to convert the pressure signal into the electrical signal and to transmit the electrical signal to the driver chip. The bending state sensor is disposed on the bendable region. The bending state sensor is electrically coupled with the driver chip through a flexible printed circuit board. The AMOLED module further comprises a detecting circuit configured to detect the bending state of the AMOLED module, the detecting circuit comprises the driver chip, the bending state sensor and a resistor with a constant resistance. The bending state sensor is a pressure sensor. The bending state sensor comprises a first pin electrically coupled with a constant voltage output pin of the driver chip, and a second pin electrically coupled with a voltage detecting pin of the driver chip and the resistor that is electrically coupled to ground. The flexible printed circuit board is electrically coupled with the display panel and is disposed on a backside of the display panel, and the bending state sensor is soldered on the flexible printed circuit board.

In the above AMOLED module of the present disclosure, the flexible printed circuit board is fixed disposed on the backside of the display panel by an adhesive material.

In the above AMOLED module of the present disclosure, the bending state sensor is a thin film pressure sensor.

In the above AMOLED module of the present disclosure, the bending states comprise an open state, a half open state, a first close state and a second close state; the open state means that the AMOLED module is flatten, the half open state means that two half panels of the AMOLED module are formed an obtuse angle or perpendicular to each other, the first close state means that the two half panels of the AMOLED module are folded as backside to backside, and the second close state means that the two half panels of the AMOLED module are folded as frontside to frontside. The displaying states comprise a single manipulation interface state displayed on full panel corresponding to the open state, two manipulation interfaces state displayed on the two half panels corresponding to the half open state, a half panel off and half panel manipulation interface state corresponding to the first close state, and a full panel off state corresponding to the second close state.

The present disclosure further provides another embodiment of AMOLED module operable in at least two bendable states. The AMOLED module comprises a display panel, a driver chip and a bending state sensor. The display panel is configured to display various display interfaces corresponding to different bendable states. The display panel comprises a bendable region. The driver chip configured to determine a bending state of the display panel according to different electrical signals, and configured to control a displaying state of the display panel according to corresponding bending state. The driver chip is disposed in the display panel and electrically coupled with the display panel. The bending state sensor is configured to receive a pressure signal when the display panel is bended, and to convert the pressure signal into the electrical signal then to transmit the electrical signal to the driver chip. The bending state sensor is disposed on the bendable region. The bending state sensor is electrically coupled with the driver chip through a flexible printed circuit board.

In this embodiment of AMOLED module of the present disclosure, the AMOLED module further comprises a detecting circuit configured to detect the bending state of the AMOLED module, the detecting circuit comprises the driver chip, the bending state sensor and a resistor with a constant resistance. The bending state sensor is a pressure sensor. The bending state sensor comprises a first pin electrically coupled with a constant voltage output pin of the driver chip, a second pin electrically coupled with a voltage detecting pin of the driver chip and the resistor that is electrically coupled to ground.

In this embodiment of AMOLED module of the present disclosure, the bending state sensor is a thin film pressure sensor.

In this embodiment of AMOLED module of the present disclosure, the flexible printed circuit board is electrically coupled with the display panel and is disposed on a backside of the display panel, and the bending state sensor is soldered on the flexible printed circuit board.

In this embodiment of AMOLED module of the present disclosure, the flexible printed circuit board is fixed disposed on the backside of the display panel by an adhesive material.

In this embodiment of AMOLED module of the present disclosure, the bending states comprises an open state, a half open state, a first close state and a second close state. The open state means that the AMOLED module is flatten. The half open state means that two half panels of the AMOLED module are formed an obtuse angle or perpendicular to each other. The first close state means that the two half panels of the AMOLED module are folded as backside to backside. The second close state means that the two half panels of the AMOLED module are folded as frontside to frontside. The displaying states comprise a single manipulation interface state displayed on full panel corresponding to the open state, two manipulation interfaces state displayed on the two half panels corresponding to the half open state, a half panel off and half panel manipulation interface state corresponding to the first close state, and a full panel off state corresponding to the second close state.

The present disclosure further provides an AMOLED module bending state displaying method used for the AMOLED module comprises the following steps.

Step S1: the bendable region of the display panel is exerted by a bending force.

Step S2: the bending state sensor receives a pressure signal, then converts the pressure signal into an electrical signal and transmits the electrical signal to a signal receiving pin of the driver chip.

Step S3: the driver chip determines the bending state of the AMOLED module according to the electrical signal, and is configured to control the display panel to display corresponding displaying state according to the bending state.

In the AMOLED module bending state displaying method of the present disclosure, the bending state sensor is a pressure sensor. The bending state sensor comprises a semiconductor component. The AMOLED module comprises a detecting circuit configured to detect the bending state of the AMOLED module. The detecting circuit comprises the driver chip, the bending state sensor and a resistor with a constant resistance. The bending state sensor comprises a first pin electrically coupled with a constant voltage output pin of the driver chip, a second pin electrically coupled with a voltage detecting pin of the driver chip and the resistor that is electrically coupled to ground.

The step of the bending state sensor receiving the pressure signal then converting the pressure signal into the electrical signal and transmitting the electrical signal to the signal receiving pin of the driver chip, comprises the following steps.

Step S21: the semiconductor component produces a resistance value while a pressure is exerted thereon.

Step S22: the driver chip provides a constant voltage value to the semiconductor component.

Step S23: bending state sensor outputs a voltage signal to the voltage detecting pin of the driver chip.

In the AMOLED module bending state displaying method of the present disclosure, the bending state sensor is a thin film pressure sensor.

In the AMOLED module bending state displaying method of the present disclosure, the flexible printed circuit board is electrically coupled with the display panel and is disposed on a backside of the display panel. The bending state sensor is soldered on the flexible printed circuit board.

The present disclosure further provides another AMOLED module bending state displaying method. The AMOLED module comprises a display panel with a bendable region, a driver chip electrically coupled with the display panel, a main control chip electrically coupled with the driver chip and a bending state sensor disposed on the bendable region. The bending state sensor is electrically coupled with the main control chip through a flexible printed circuit board. The AMOLED module bending state displaying method comprises the following steps.

The bendable region of the display panel is exerted by a bending force.

The bending state sensor receives a pressure signal, then converts the pressure signal into an electrical signal and transmits the electrical signal to a signal receiving pin of the main control chip.

The main control chip determines the bending state of the AMOLED module then transmits a corresponding displaying signal to the driver chip.

The driver chip is configured to control the display panel to display corresponding displaying state according to the displaying signal.

In view of the deficiency of the conventional technology described above, the AMOLED module and the first bending state displaying method have the following advantages. First of all, the displaying state of the display panel can be directly controlled by the driver chip because the bending state sensor is disposed on the bendable region of the display panel and directly coupled with the driver chip. It increases the efficiency and compatibility. The technical problems of taking up the resource of main control chip of AMOLED module and degrading the efficiency of determination during determining the bending state of conventional AMOLED module can be solved by realizing the present disclosure. Second, by utilizing the bending state sensor, the varies of the resistance value of the bending state sensor corresponding to the bending degree of the display panel in the AMOLED module can be converted into the varies of voltage value with a continuous and monotonous relation. As the voltage value corresponding to each bending degree of the bending AMOLED module exists inevitably and is unique, the AMOLED module is monitored definitely. Therefore, the accuracy for determining the bending degrees of the display panel can be increased and the bending track of the display panel is easily monitored. Third, by utilizing the bending state sensor and the feedback method of resistance in relation to voltage, the capability of interference resistant can be increased, and the accuracy for determining the bending degrees of the display panel by the driver chip can be increased subsequently.

BRIEF DESCRIPTION OF THE SEVERAL VIEWS OF THE DRAWINGS

In order to illustrate the exemplary embodiments of the present disclosure or the technical solution of conventional technology more clear, below follows brief description of drawings. Some embodiments of the present disclosure are herein described, by way of example only, with reference to the accompanying drawings. The description taken with the drawings makes apparent to those skilled in the art how embodiments of the present disclosure may be practiced without inventive effort. In the drawings.

DESCRIPTION OF SPECIFIC EMBODIMENTS OF THE INVENTION

Following detailed description and drawings with reference to the exemplary embodiments of the present disclosure are described below in further detail for the purposes of making the objective, technical solutions, and the effect of the present disclosure more clear and specific. It should be understood that the specific embodiments described herein are only for explaining the present disclosure and are not intended to limit the scope of the present invention.

Figure 1:
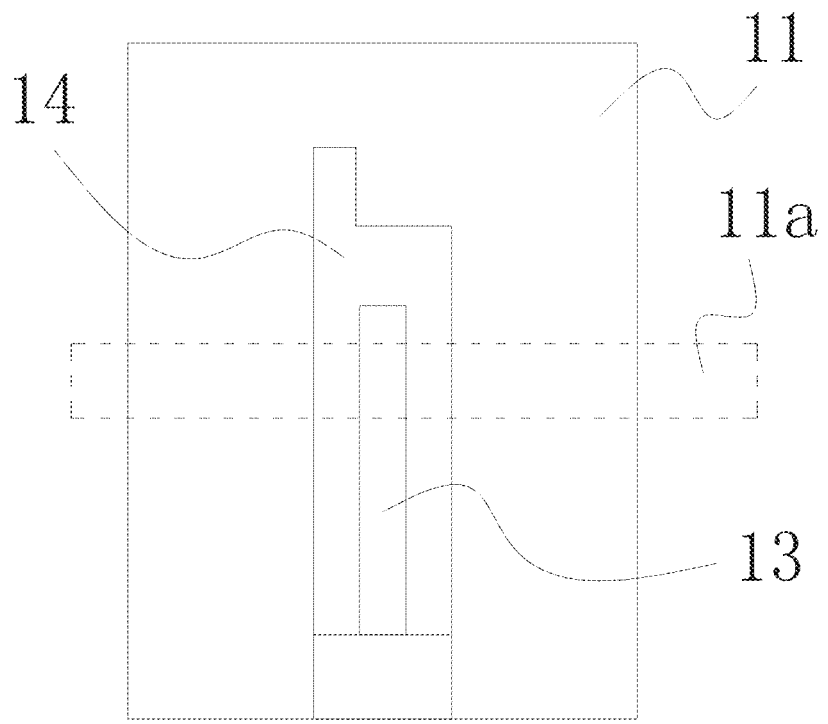
FIG. 1 shows a schematic diagram illustrating a backside structure of the embodiment of the AMOLED module of the present disclosure.

Refer to FIG. 1, which shows a schematic diagram illustrating a backside structure of the first embodiment of the AMOLED module of the present disclosure. In first embodiment of AMOLED module of the present disclosure, which is operable in at least two bendable states, the AMOLED module comprises a display panel 11, a driver chip 12, a bending state sensor 13 and a flexible printed circuit board 14. Preferably, the display panel 11 is configured to display various display interfaces corresponding to different bendable states, display panel 11 comprises a bendable region 11a configured to be bended. The driver chip 12 is configured to determine a bending state of display panel 11 according to different electrical signals, and is configured to control a displaying state of display panel 11 according to corresponding bending state, driver chip 12 is disposed in display panel 11 and electrically coupled with display panel 11. The bending state sensor 13 is configured to receive a pressure signal when display panel 11 is bended. The bending state sensor 13 is configured to convert the pressure signal into an electrical signal and to transmit the electrical signal to driver chip 12. The bending state sensor 13 is disposed on a bendable region 11a. The bending state sensor 13 is electrically coupled with driver chip 12 through the flexible printed circuit board 14. As bending state sensor 13 is directly disposed on bendable region 11a, the bending state sensor 13 on bendable region 11a is bended simultaneously when display panel 11 is bended. Consequently, a semiconductor component of bending state sensor 13 produces a resistance value while a pressure is exerted thereon, then the determination for the bending state of AMOLED module is rapidly accomplished by the operation of detecting circuit. In this embodiment of the present disclosure, the displaying state of the display panel 11 can be directly controlled by the driver chip 12 because the bending state sensor 13 is disposed on the bendable region 11a of the display panel 11 and directly coupled with the driver chip 12. It increases the efficiency and compatibility.

Figure 2:
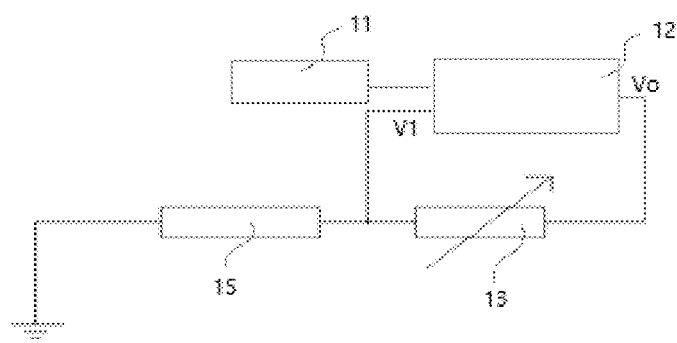
FIG. 2 shows a schematic diagram illustrating the detecting circuit of the embodiment of the AMOLED module of the present disclosure.
Figure 3:
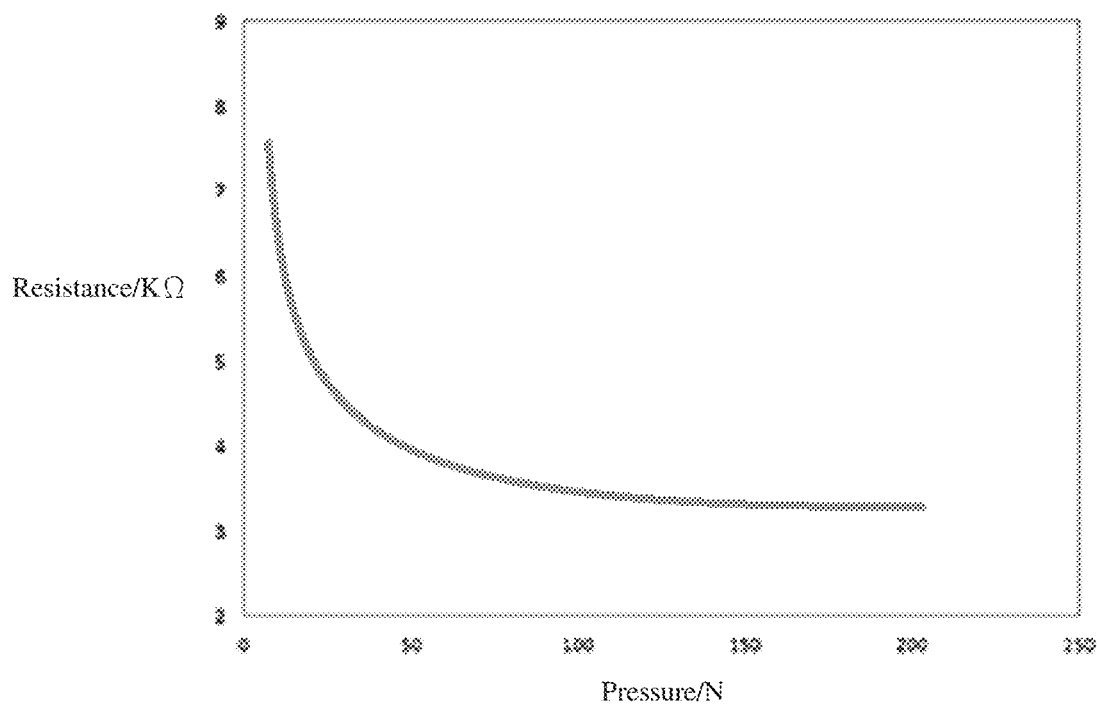
FIG. 3 shows a schematic diagram illustrating the curve graph of resistance with respect to pressure for the bending state sensor in the embodiment of the AMOLED module of the present disclosure.

Refer to FIG. 2, the AMOLED module of this embodiment of the present disclosure comprises the detecting circuit configured to detect the bending state of the AMOLED module, the detecting circuit comprises driver chip 12, the bending state sensor 13 and a resistor 15 with a constant resistance. The bending state sensor 13 is a pressure sensor. Meanwhile, the bending state sensor 13 comprises a first pin electrically coupled with a constant voltage output pin $V_O$ of driver chip 12, and a second pin electrically coupled with a voltage detecting pin V1 of driver chip 12 and resistor 15 that is electrically coupled to ground. In the detecting circuit, the bending state sensor 13, as a pressure sensor, is substantially equivalent to a resistor within the detecting circuit. The bending state sensor 13 disposed on bendable region 11a is bended simultaneously when display panel 11 is bended. Consequently, the semiconductor component of bending state sensor 13 produces a resistance value while a pressure is exerted thereon. Refer to FIG. 3, the resistance value of bending state sensor 13 descends as long as the pressure ascends by a monotonous way, that is, the resistance value is in a maximum value when the pressure is zero as bending state sensor 13 is not bended.

Additionally, in the detecting circuit, the voltage value produced by bending state sensor 13 varies corresponding to the varies of resistance value of bending state sensor 13 while the resistance value of bending state sensor 13 varies corresponding to the varies of the pressure exerted on bending state sensor 13. Therefore, the driver chip 12 is capable of determining the current bending state of display panel 11 according to the voltage value produced by bending state sensor 13.

By utilizing the bending state sensor 13, the varies of the resistance value of bending state sensor 13 corresponding to the bending degree of display panel 11 in the AMOLED module can be converted into the varies of voltage value with a continuous and monotonous relation. As the voltage value corresponding to each bending degree of the bending AMOLED module exists inevitably and is unique, the AMOLED module is monitored definitely. Therefore, the accuracy for determining the bending degrees of display panel 11 can be increased and the bending track of the display panel 11 is easily monitored. Furthermore, by utilizing the feedback method of resistance in relation to voltage, the capability of interference resistant can be increased, and the accuracy for determining the bending degrees of display panel 11 by driver chip 12 can be increased subsequently.

In this embodiment of the AMOLED module of the present disclosure, the bending state sensor 13 is a thin film pressure sensor. The flexible printed circuit board 14 is electrically coupled with display panel 11 and is disposed on a backside of display panel 11, and bending state sensor 13 is soldered on flexible printed circuit board 14. In this circumstance, the bending state sensor 13 is easily disposed on flexible printed circuit board 14. Additionally, as the bending state sensor 13 is a thin film type sensor, one aspect is capable of saving the assembly space, and another aspect is capable of increasing the sensitivity of bending sense. Further, the flexible printed circuit board 14 is fixed disposed on the backside of display panel 11 by an adhesive material.

The assembly procedure for bending state sensor 13 comprises the steps of: first, soldering bending state sensor 13 onto flexible printed circuit board 14 through a Surface Mount Technology (SMT) phase; then bending flexible printed circuit board 14 to the backside of display panel 11; finally, mounting a sensing region of bending state sensor 13 onto flexible printed circuit board 14 corresponding to bendable region 11a of display panel 11.

Figure 4:
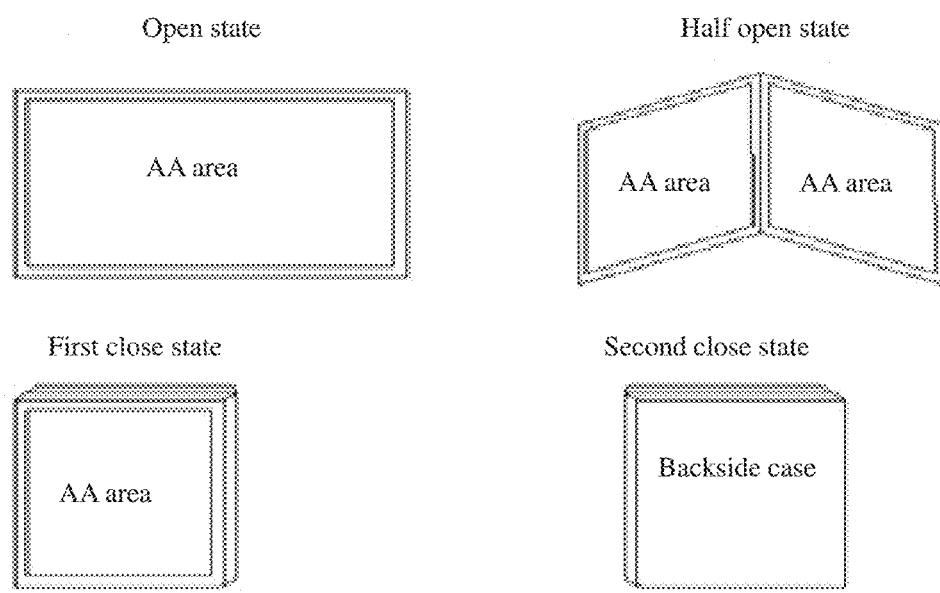
FIG. 4 shows a schematic diagram illustrating structures as the open state, the half open state, the first close state and the second close state of the embodiment of the AMOLED module of the present disclosure.

In this embodiment of the AMOLED module of the present disclosure, refer to FIG. 4, the bending states comprise an open state, a half open state, a first close state and a second close state. The open state means that the AMOLED module is flatten. The half open state means that two half panels of the AMOLED module are formed an obtuse angle or perpendicular to each other. The first close state means that two half panels of the AMOLED module are folded as backside to backside, and the second close state means that two half panels of the AMOLED module are folded as frontside to frontside.

The displaying states comprise a single manipulation interface state displayed on full panel corresponding to the open state, two manipulation interfaces state displayed on the two half panels corresponding to the half open state, a half panel off and half panel manipulation interface state corresponding to the first close state, and a full panel off state corresponding to the second close state.

In this embodiment, the AA area illustrated in FIG. 4 means a displaying area. The application scenarios for each bending state are as below: user can watch movies and play games for the application scenario which needs a bigger displaying area when the displaying state is in the open state; user can use one half panel to chat online and use another half panel to check stock trend immediately or watch movies which needs to simultaneously manipulate operations for different demands when the displaying state is in the half open state; user's demand is same as operations on a smaller panel, like smartphones, when the displaying state is in the first close state; user's demand is to standby or turn off display panel 11 when the displaying state is in the second close state. Certainly, the bending states can be other states, and the displaying states also can be other states. The bending states and corresponding displaying states of the present disclosure are not intended to limit by the exemplary embodiments.

Figure 5:
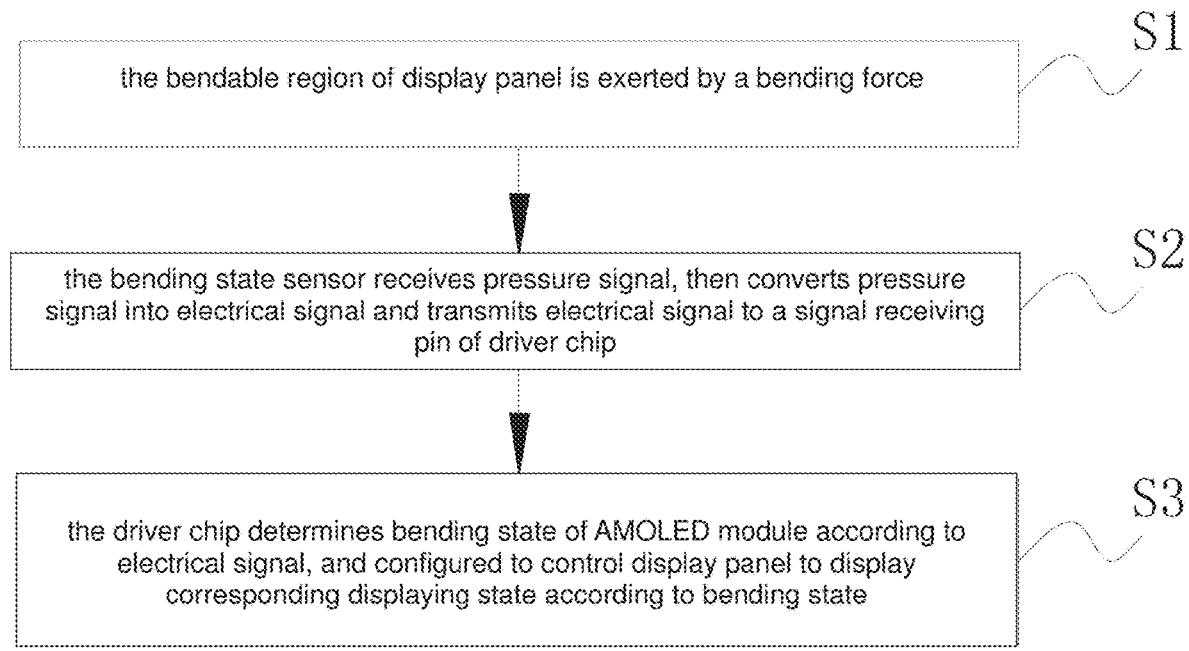
FIG. 5 shows a flowchart of the AMOLED module bending state displaying method of the present disclosure.
Figure 6:
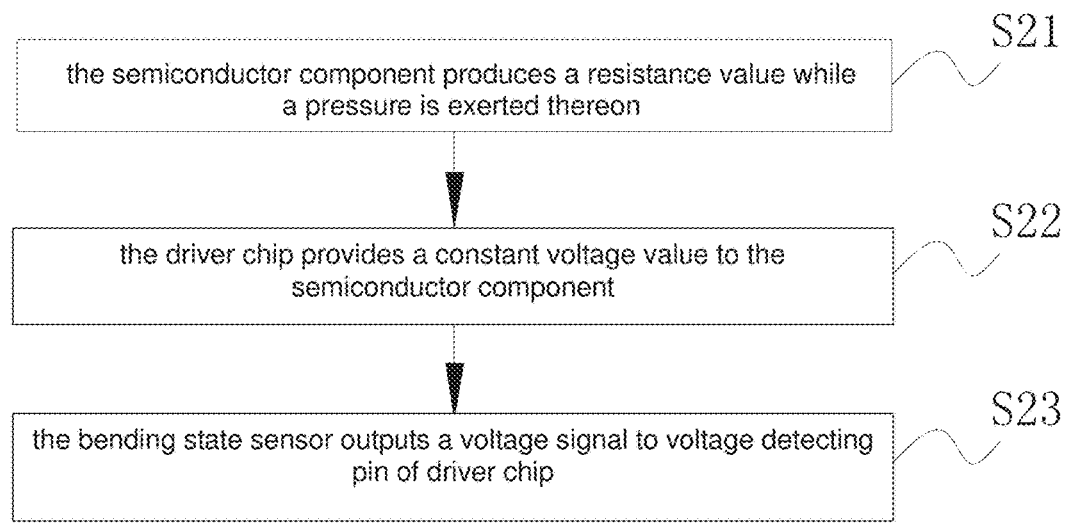
FIG. 6 shows a specific flowchart of the step S2 illustrated in FIG. 5.

Refer to FIG. 5, which shows a flowchart of the second embodiment of the AMOLED module bending state displaying method of the present disclosure. The structure of the AMOLED module in second embodiment is the same with the first embodiment of the present disclosure. The AMOLED module bending state displaying method comprises the following steps.

Step S1: the bendable region 11a of display panel 11 is exerted by a bending force.

Step S2: the bending state sensor 13 receives the pressure signal, then converts the pressure signal into the electrical signal and transmits the electrical signal to a signal receiving pin of driver chip 12.

Step S3: the driver chip 12 determines the bending state of the AMOLED module according to the electrical signal, and is configured to control display panel 11 to display corresponding displaying state according to the bending state.

In the AMOLED module bending state displaying method of the disclosure, the bending state sensor 13 is exerted by the bending force to receive the pressure signal then convert the pressure signal into the electrical signal and directly transmit the electrical signal to the signal receiving pin of driver chip 12. The method dispenses with the step of transmitting the electrical signal to the main control chip of the AMOLED module and then transmitting an instruction to driver chip 12 by the main control chip. It is contributive to saving the resource of the main control chip and increasing the efficiency of determination, and is contributive to avoiding the circumstance of inaccuracy of bending states determination if the main control chip being interfered.

In the AMOLED module bending state displaying method of the present disclosure, the bending state sensor 13 is a pressure sensor, the bending state sensor 13 comprises a semiconductor component, the AMOLED module comprises a detecting circuit configured to detect the bending state of the AMOLED module, the detecting circuit comprises the driver chip 12, the bending state sensor 12 and the resistor 15 with a constant resistance. Meanwhile, the bending state sensor 13 comprises a first pin electrically coupled with a constant voltage output pin $V_O$ of driver chip 12, and a second pin electrically coupled with a voltage detecting pin V1 of driver chip 12 and resistor 15 that is electrically coupled to ground. The above-mentioned step S2 further comprises the steps of:

Step S21: the semiconductor component produces a resistance value while a pressure is exerted thereon;

Step S22: the driver chip 12 provides a constant voltage value to the semiconductor component;

Step S23: the bending state sensor 13 outputs a voltage signal to the voltage detecting pin of the driver chip.

In the step S21, the semiconductor component produces a resistance value while a bending force is exerted thereon. In bending state sensor 13, refer to FIG. 3, the resistance value of bending state sensor 13 descends as long as the pressure ascends by a monotonous way, that is, the resistance value is in a maximum value when the pressure is zero as bending state sensor 13 is not bended. Additionally, the varies of resistance value of bending state sensor 13 are converted into the varies of voltage value, driver chip 12 provides a constant voltage across the semiconductor, and as the resistance of resistor 15 is also a constant value, thus, in the step S22, the output voltage of bending state sensor 13 varies in a continuous and monotonous way, such that the voltage value corresponding to each bending degree of the bending AMOLED module exists inevitably and is unique, the AMOLED module is monitored definitely. Therefore, the accuracy for determining the bending degrees of the display panel can be increased and the bending track of the display plane is easily monitored.

In the AMOLED module bending state displaying method of the present disclosure, the bending state sensor 13 is a thin film pressure sensor.

In the AMOLED module bending state displaying method of the present disclosure, the flexible printed circuit board 14 is electrically coupled with display panel 11 and is disposed on the backside of display panel 11, and bending state sensor 13 is soldered on flexible printed circuit board 14.

The present disclosure further discloses a third embodiment of the AMOLED module bending state displaying method, the AMOLED module of the third embodiment comprises a display panel with a bendable region, a driver chip electrically coupled with the display panel, a main control chip electrically coupled with the driver chip and a bending state sensor disposed on the bendable region, the bending state sensor is electrically coupled with the main control chip through a flexible printed circuit board. The AMOLED module bending state displaying method comprises the following steps.

The bendable region of the display panel is exerted by a bending force.

The bending state sensor receiving a pressure signal, then converting the pressure signal into an electrical signal and transmitting the electrical signal to a signal receiving pin of the main control chip.

The main control chip determining the bending state of the AMOLED module then transmitting a corresponding displaying signal to the driver chip.

The driver chip configured to control the display panel to display corresponding displaying state according to the displaying signal.

In the method of this embodiment, it increases the relativity of the method and the display panel itself by disposing the bending state sensor on the bendable region of the display panel, and the bending state of the AMOLED module can be determined directly by converting the pressure value of the bending state sensor into the electrical signal. Further, the loading of the driver chip can be alleviated by using the main control chip to handle and process the determination of the bending state.

In the method of this embodiment, the AMOLED comprises a detecting circuit. A difference between this detecting circuit and the mentioned detecting circuit of the AMOLED module of abovementioned embodiment is that the driver chip is replaced by the main control chip for directly determining the bending state of the AMOLED module.

In view of the deficiency of the conventional technology described above, the AMOLED module and the first bending state displaying method have the advantages as follows:

First of all, the displaying state of the display panel can be directly controlled by the driver chip because the bending state sensor is disposed on the bendable region of the display panel and directly coupled with the driver chip. It increases the efficiency and compatibility. The technical problems of taking up the resource of main control chip of AMOLED module and degrading the efficiency of determination during determining the bending state of conventional AMOLED module can be solved by realizing the present disclosure.

Second, by utilizing the bending state sensor, the varies of the resistance value of the bending state sensor corresponding to the bending degree of the display panel in the AMOLED module can be converted into the varies of voltage value with a continuous and monotonous relation. As the voltage value corresponding to each bending degree of the bending AMOLED module exists inevitably and is unique, the AMOLED module is monitored definitely. Therefore, the accuracy for determining the bending degrees of the display panel can be increased and the bending track of the display panel is easily monitored.

Third, by utilizing the bending state sensor and the feedback method of resistance in relation to voltage, the capability of interference resistant can be increased, and the accuracy for determining the bending degrees of the display panel by the driver chip can be increased subsequently.

Some embodiments of the invention are herein described, by way of example only, with reference to the accompanying drawings. With specific reference now to the drawings in detail, it is noted that the particulars shown are by way of example and for purposes of illustrative discussion of embodiments of the invention. In this regard, the description taken with the drawings makes apparent to those skilled in the art how embodiments of the invention may be practiced.

The present disclosure discloses several embodiments for the purposes of making the objective, technical solutions, and the effect of the present disclosure more clear and specific, the order used for introducing the embodiments, such as the first, the second, is just for the conveniencies of description, and should not be considered to limit the present invention. It should be understood that the specific embodiments described herein are only for explaining the present disclosure and are not intended to limit the present invention. It should be understood that this invention is not limited to the foregoing description of the disclosed embodiments. Various changes and modifications can be made to the invention in light of the above detailed description by those skilled in the art. These changes and modifications are possible within the scope of the invention as defined by the following claims.

What is claimed is:

1. An active-matrix organic light emitting diode (AMOLED) module operable in at least two bendable states, comprising:

a display panel, configured to display various display interfaces corresponding to different bendable states, said display panel comprising a bendable region;

a driver chip, configured to determine a bending state of said display panel according to different electrical signals, and configured to control a displaying state of said display panel according to corresponding bending state, wherein said driver chip is disposed in said display panel and electrically coupled with said display panel; and a bending state sensor, configured to receive a pressure signal when said display panel is bended, to convert said pressure signal into said electrical signal and to transmit said electrical signal to said driver chip, wherein said bending state sensor is disposed on said bendable region;

wherein said bending state sensor is electrically coupled with said driver chip through a flexible printed circuit board;

wherein said AMOLED module further comprises a detecting circuit configured to detect the bending state of said AMOLED module, said detecting circuit comprises said driver chip, said bending state sensor and a resistor with a constant resistance, wherein said bending state sensor is a pressure sensor;

wherein said bending state sensor comprises a first pin electrically coupled with a constant voltage output pin of said driver chip, and a second pin electrically coupled with a voltage detecting pin of said driver chip and said resistor that is electrically coupled to ground;

wherein said flexible printed circuit board is electrically coupled with said display panel and is disposed on a backside of said display panel, and said bending state sensor is soldered on said flexible printed circuit board;

wherein said bending states comprise an open state, a half open state, a first close state and a second close state; said open state means that said AMOLED module is flatten, said half open state means that two half panels of said AMOLED module are formed an obtuse angle or perpendicular to each other, said first close state means that said two half panels of said AMOLED module are folded as backside to backside, and said second close state means that said two half panels of said AMOLED module are folded as frontside to frontside;

wherein said displaying states comprise a single manipulation interface state displayed on full panel corresponding to said open state, two manipulation interfaces state displayed on said two half panels corresponding to said half open state, a half panel off and half panel manipulation interface state corresponding to said first close state, and a full panel off state corresponding to said second close state.

2. The AMOLED module according to claim 1, wherein said flexible printed circuit board is fixed disposed on said backside of said display panel by an adhesive material.

3. The AMOLED module according to claim 1, wherein said bending state sensor is a thin film pressure sensor.

4. An AMOLED module bending state displaying method used for said AMOLED module claimed in claim 1, comprising the steps of:
- said bendable region of said display panel is exerted by a bending force;
- said bending state sensor receiving said pressure signal, then converting said pressure signal into said electrical signal and transmitting said electrical signal to a signal receiving pin of said driver chip; and
- said driver chip determining said bending state of said AMOLED module according to said electrical signal, and configured to control said display panel to display corresponding displaying state according to said bending state.

5. The AMOLED module bending state displaying method of claim 4, wherein said bending state sensor is a pressure sensor, said bending state comprises a semiconductor component, said AMOLED module comprises a detecting circuit configured to detect said bending state of said AMOLED module, said detecting circuit comprises said driver chip, said bending state sensor and a resistor with a constant resistance;

wherein said bending state sensor comprises a first pin electrically coupled with a constant voltage output pin of said driver chip, a second pin electrically coupled with a voltage detecting pin of said driver chip and said resistor that is electrically coupled to ground;

the steps of said bending state sensor receiving said pressure signal then converting said pressure signal into said electrical signal and transmitting said electrical signal to said signal receiving pin of said driver chip, comprises:

said semiconductor component produces a resistance value while a pressure is exerted thereon;

said driver chip provides a constant voltage value to said semiconductor component; and said bending state sensor outputs a voltage signal to said voltage detecting pin of said driver chip.

6. The AMOLED module bending state displaying method of claim 5, wherein said bending state sensor is a thin film pressure sensor.

7. The AMOLED module bending state displaying method of claim 4, wherein said flexible printed circuit board is electrically coupled with said display panel and is disposed on a backside of said display panel, and said bending state sensor is soldered on said flexible printed circuit board.

* * * * *